(12) United States Patent
Nam et al.

(10) Patent No.: US 8,187,927 B2
(45) Date of Patent: May 29, 2012

(54) LIQUID CRYSTAL DISPLAY AND FABRICATION METHOD THEREOF

(75) Inventors: Seung-Hee Nam, Suwon (KR); Nam-Kook Kim, Suwon (KR); Soon-Sung Yoo, Gunpo (KR); Youn-Gyoung Chang, Anyang (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/963,403

(22) Filed: Dec. 8, 2010

(65) Prior Publication Data

US 2011/0079853 A1 Apr. 7, 2011

Related U.S. Application Data

(62) Division of application No. 11/968,065, filed on Dec. 31, 2007, now Pat. No. 7,867,796.

(30) Foreign Application Priority Data

Mar. 12, 2007 (KR) ........................ 10-2007-0024185

(51) Int. Cl.
 H01L 21/00 (2006.01)
 H01L 21/84 (2006.01)
 H01L 21/44 (2006.01)
(52) U.S. Cl. .......... 438/149; 438/30; 438/151; 438/669; 438/703; 257/E21.411; 257/E21.414; 257/E21.535; 257/E21.582
(58) Field of Classification Search ........... 257/E21.411, 257/E21.414, E21.535, E21.582
See application file for complete search history.

(56) References Cited

U.S. PATENT DOCUMENTS

| 7,489,380 | B2 | 2/2009 | Lim et al. | |
| 7,537,975 | B2* | 5/2009 | Moon et al. | 438/149 |
| 2003/0219920 | A1 | 11/2003 | Baek et al. | |
| 2006/0240605 | A1* | 10/2006 | Moon et al. | 438/149 |
| 2006/0290866 | A1 | 12/2006 | Choi et al. | |
| 2007/0242178 | A1 | 10/2007 | Kawasaki et al. | |

\* cited by examiner

*Primary Examiner* — Mohsen Ahmadi
(74) *Attorney, Agent, or Firm* — Brinks Hofer Gilson & Lione

(57) ABSTRACT

A method for fabricating an LCD includes: providing a substrate with a thin film transistor (TFT) part defined thereon; forming a metallic film for a gate electrode on the substrate; etching the metallic film through a first printing process to form a gate electrode; sequentially forming a gate insulating layer, a semiconductor layer, and a metallic film for source and drain electrodes on the substrate; selectively etching the metallic film for source and drain electrodes, the semiconductor layer and the gate insulating layer through a second printing process to form a gate insulating layer pattern, a preliminary active pattern and a metallic film pattern which are sequentially stacked such that the gate insulating layer pattern is over-etched from the side of the preliminary active pattern; forming an insulating layer on the substrate with the metallic film pattern; etching the insulating layer to expose the metallic film pattern; forming a transparent conductive film on the metallic film pattern and a remaining insulating film; and selectively etching the transparent conductive film, the metallic film pattern, the preliminary active pattern to form an active pattern, a source electrode, a drain electrode, and a pixel electrode connected with the drain electrode.

9 Claims, 5 Drawing Sheets

2

LIQUID CRYSTAL DISPLAY AND FABRICATION METHOD THEREOF

The present patent document is a divisional of U.S. patent application Ser. No. 11/968,065, filed Dec. 31, 2007 now U.S. Pat. No. 7,867,796, which claims priority to Korean Patent Application No. 10-2007-0024185 filed in Korea on Mar. 12, 2007, which is hereby incorporated by reference.

BACKGROUND

1. Field of the Invention

The present invention relates to a liquid crystal display and its fabrication method, and more particularly, to a liquid crystal display and its fabrication method capable of simplifying a process.

2. Discussion of the Related Art

In general, a liquid crystal display (LCD) displays images by controlling light transmittance of liquid crystal by using electric fields. LCDs are divided into a vertical field application type LCD and a horizontal field (in-plane) field application type LCD according to the direction of electric fields driving the liquid crystals.

The vertical field application type LCD drives TN (Twisted Nematic) mode liquid crystals by a vertical electric field formed between pixel electrodes and common electrodes disposed to face each other on upper and lower substrates. Such vertical field application type LCD advantageously has a large aperture ratio but is disadvantageous in that its viewing angle is narrow as 90°.

On the other hand, the in-plane field application type LCD drives IPS (In-Plane Switch) mode liquid crystals by an in-plane field between pixel electrodes and common electrodes disposed to be parallel to each other on a lower substrate. Such in-plane field application type LCD advantageously has a wide viewing angle of about 160° but is disadvantageous in that its aperture ratio and transmittance are low.

Thus, in order to improve the shortcomings of the in-plane field application type LCD, a fringe field switching (FFS) mode LCD that operates using a fringe field has been proposed.

In the FFS mode LCD, a common electrode plate and pixel electrodes are formed with an insulation film interposed therebetween at a pixel area, and in this case, the space between the common electrode plate and the pixel electrodes is narrower than that between upper and lower substrates to form a fringe field. Liquid crystal molecules filled between the upper and lower substrates operate to thus improve an aperture ratio and transmittance.

FIG. 1 is a sectional view showing a schematic construction of the FFS mode LCD according to the related art. FIGS. 2a to 2e are sectional views showing the sequential processes of fabricating the FFS mode LCD. The related art FFS mode LCD and its fabrication method will now be described with reference to FIG. 1 and FIGS. 2a to 2e.

Referring to FIG. 1, the related art FFS mode TFT substrate includes a gate line (not shown) and a data line 4 formed to cross each other with a gate insulating layer 22 interposed therebetween on a substrate 20, a thin film transistor (TFT) formed at each crossing of the gate line and the data line, a common electrode plate 14 and pixel electrode slits 18 formed with the gate insulating layer 22 and a passivation film 28 interposed therebetween to form a fringe field at a pixel area formed with a crossing structure of the gate line and the data line, and a common line 16 connected with the common electrode plate 14.

The common electrode plate 14 receives a reference voltage through the common line 16 which is formed on the common electrode plate 14 and connected with the common electrode plate 14 at each pixel area. The common electrode plate 14 is formed of a transparent conductive layer, and the common line 16 is formed of a gate metallic layer together with the gate line.

In the TFT, a pixel signal of the data line 4 is charged in the pixel electrode slits 18 and maintained in response to a gate signal of the gate line.

For this purpose, the TFT includes a gate electrode 6 connected with the gate line, a source electrode 8 connected with the data line 4, a drain electrode 10 connected with the pixel electrode slits 18, an active layer 24 overlapping with the gate electrode 6 with the gate insulating layer 22 and forming a channel between the source electrode 8 and the drain electrode 10, and an ohmic-contact layer 26 for ohmic-contacting with the source electrode 8, the drain electrode 10, and the active layer 24.

The pixel electrode slits 18 are connected with the drain electrode 10 of the TFT via a contact hole 12 that penetrates the passivation layer 28 so as to overlap with the common electrode plate 14. Such pixel electrode slits 18 form a fringe field with the common electrode plate 14 to allow liquid crystal molecules arranged in a horizontal direction between the TFT substrate and a color filter substrate to be rotated by dielectric anisotropy. Transmittance of light that transmits through the pixel area varies according to the rotation degree of the liquid crystal molecules to thus represent gray scales.

A storage capacitor that stably maintains a video signal supplied to the pixel electrode slits 18 is formed at the overlap portion of the common electrode plate 14 and the pixel electrode slits 18.

The fabrication method of the FFS mode TFT substrate will now be described with reference to FIGS. 2a to 2e.

As shown in FIG. 2a, the common electrode plate 14 is formed at each pixel area of the substrate 20. The common electrode plate 14 is formed at each pixel area by forming a transparent conductive film on the substrate 20 and then patterning the transparent conductive film according to a first photomasking process.

As shown in FIG. 2b, the gate line including the gate electrode 6 and the common line 16 are formed on the substrate 20 with the common electrode plate 14 formed thereon through a second photomasking process. The gate line and the common line 16 are formed such that a metallic film for the gate line is formed on the substrate 20 with the common electrode plate 14 formed thereon and then patterned through the second photomasking process.

As shown in FIG. 2c, the gate insulating layer 22 is formed on the substrate 20 with a gate metallic pattern formed thereon, and a semiconductor pattern including the active layer 24 and the ohmic-contact layer 26, and a source/drain metallic pattern including the data line 4, the source electrode 8 and the drain electrode 10 are formed.

In detail, the gate insulating layer 22, an amorphous silicon layer, an n+ amorphous silicon layer, and source/drain metallic layers are sequentially formed on the substrate 20 with the gate metallic pattern formed thereon. And then, a photoresist pattern having a step is formed on the source/drain metallic pattern through a photolithography process using a third mask, a slit (diffraction) exposure mask. The photoresist pattern having a step has a relatively lower height at a channel part of the TFT. Through the etching process using the photoresist pattern, there are formed source and drain patterns and a semiconductor pattern therebelow. Subsequently, the photoresist pattern is ashed and the exposed source and drain patterns are removed together with the lower ohmic-contact layer 26 to separate the source electrode 8 and the drain electrode 10.

As shown in FIG. 2*d*, the passivation layer 28 with an opening 12 is formed on the source and drain electrodes 8 and 10 and the gate insulating layer 22 through a fourth photomasking process. Namely, the passivation layer 28 is formed on the source and drain electrodes 8 and 10 and the gate insulating layer 22 and then patterned through the fourth photomasking process to form the opening 12 exposing the drain electrode 10.

As shown in FIG. 2*e*, the pixel electrode slits 18 are formed on the passivation layer 28 through a fifth photomasking process. The pixel electrode slits 18 are formed such that a transparent conductive layer is formed on the passivation layer 28 and then patterned through a photolithography process using a fifth photo mask and an etching process.

In the related art FFS mode TFT substrate fabrication method, a total of five masks are used, and in this case, the number of masks indicates the number of processes for fabricating an array substrate. In this case, the photolithography process accompanies several processes such as washing, and coating, exposing, developing and etching of a photosensitive film, causing a problem that much processing time is taken and a fabrication cost increases.

Thus, if only one time of photolithography process would be omitted, the fabrication time could be considerably shortened and the fabrication cost and the defect rate could be also reduced. Thus, a method for reducing the number of masks needs to be proposed.

BRIEF SUMMARY

Therefore, in order to address the above matters the various features described herein have been conceived. One aspect of the exemplary embodiments is to provide a liquid crystal display (LCD) and its fabrication method capable of simplifying a process by reducing the number of photomasks used.

This specification provides a method for fabricating an LCD including: providing a substrate with a thin film transistor (TFT) part defined thereon; forming a metallic film for a gate electrode on the substrate; etching the metallic film through a first printing process to form a gate electrode; sequentially forming a gate insulating layer, a semiconductor layer, and a metallic film for source and drain electrodes on the substrate; selectively etching the metallic film for source and drain electrodes, the semiconductor layer and the gate insulating layer through a second printing process to form a gate insulating layer pattern, a preliminary active pattern and a metallic film pattern which are sequentially stacked such that the gate insulating layer pattern is over-etched from the side of the preliminary active pattern; forming an insulating layer on the substrate with the metallic film pattern; etching the insulating layer to expose the metallic film pattern; forming a transparent conductive film on the metallic film pattern and a remaining insulating film; and selectively etching the transparent conductive film, the metallic film pattern, the preliminary active pattern to form an active pattern, a source electrode, a drain electrode, and a pixel electrode connected with the drain electrode.

This specification also provides a liquid crystal display (LCD) including: a substrate with a thin film transistor (TFT) part, a pixel part, and a gate pad part defined thereon; a gate electrode and a gate pad formed on the substrate; a gate insulating layer pattern, an active pattern, and source and drain electrodes sequentially formed on the substrate with the gate pad formed thereon; a first transparent conductive film pattern that covers a common electrode and the gate pad on the substrate with the source and drain electrodes and is formed of the same layer as the common electrode; an insulating layer covering the first transparent conductive film pattern and having an opening that exposes the source and drain electrodes and a portion corresponding to the gate pad; and a pixel electrode formed on the insulating layer and covering the drain electrode, and a second transparent conductive film pattern formed on the insulating layer, connected with the first transparent conductive film pattern via the opening and formed on the same layer on which the pixel electrode is formed.

DETAILED DESCRIPTION OF THE DRAWINGS AND THE PRESENTLY PREFERRED EMBODIMENTS

Figure 1:
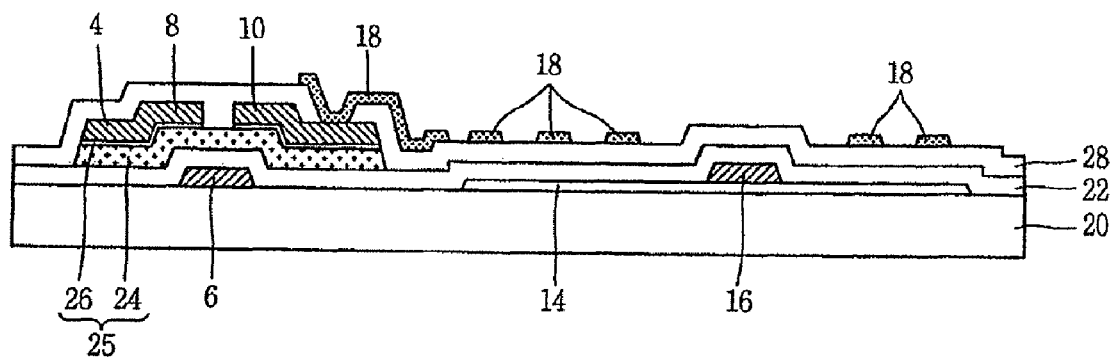
FIG. 1 is a sectional view showing a schematic construction of a fringe field switching (FFS) mode liquid crystal display (LCD) according to the related art.
Figure 2A:
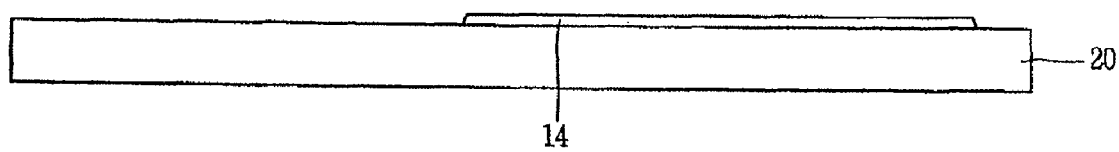
FIGS. 2*a* to 2*e* are sectional views showing sequential processes of fabricating the FFS mode LCD according to the related art.
Figure 2B:
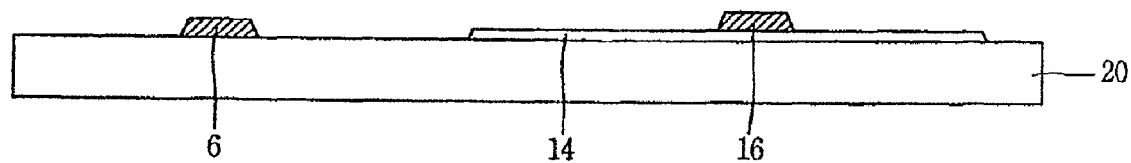
Figure 2C:
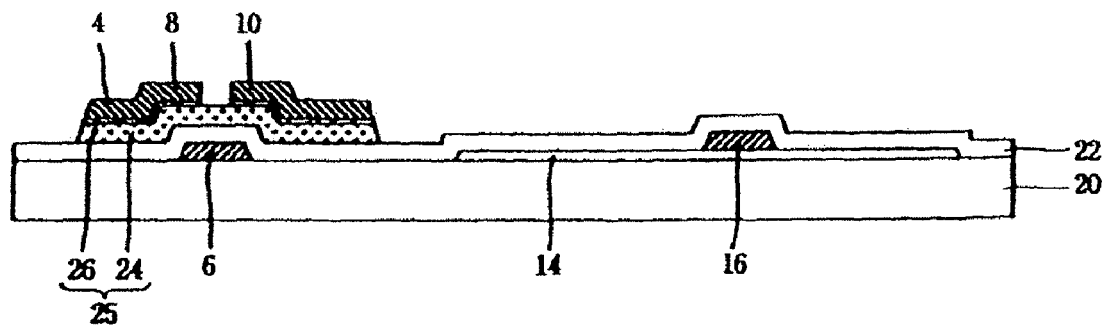
Figure 2D:
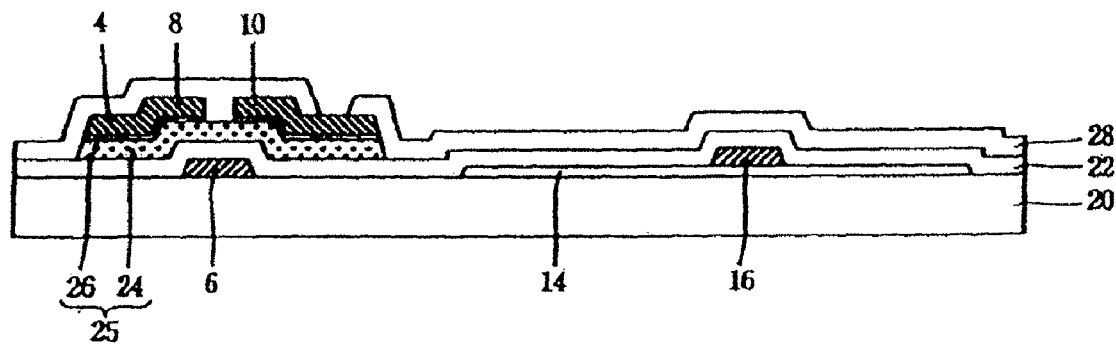
Figure 2E:
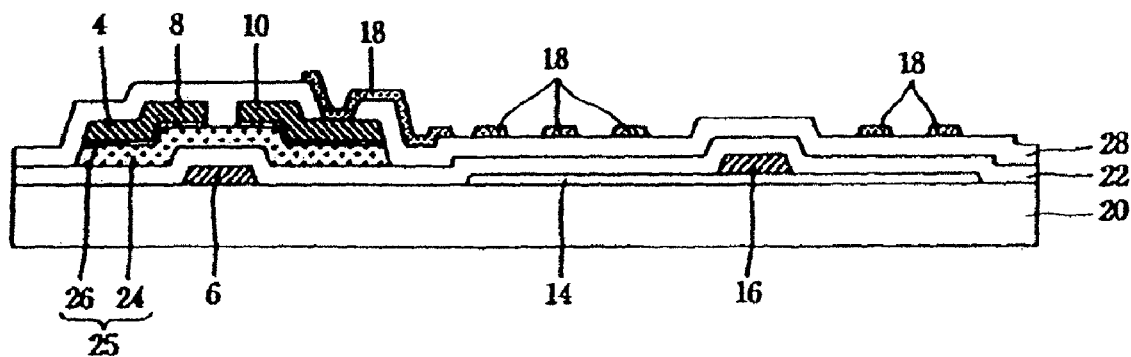

A liquid crystal display (LCD) and its fabrication method according to the present disclosure will now be described with reference to the accompanying drawings.

In the disclosed embodiments, in order to simplify the process by reducing the number of photomasks, a printing process, instead of a photolithography process, is applied. Namely, a gate line having a gate electrode and a gate pad is formed by using a first printing process, source and drain electrodes are formed by using a second printing process, and an opening exposing the gate pad is formed by using a third printing process. And the source electrode, the drain electrode and a pixel electrode are sequentially formed by using a photomasking process.

Thus, in the disclosed embodiments, the FFS mode LCD is fabricated by performing a total of three printing processes and a single photomasking process, thereby simplifying the photomasking process, and thus, reducing a material cost and a facility investment cost, and improving a production yield.

FIGS. 3*a* to 3*i* are sectional views showing the schematic construction of an FFS mode LCD according to the present disclosure. Here, a left portion of the drawing includes a TFT part and a pixel part, a middle portion includes a gate pad part, and a right portion includes a data pad part.

Figure 3A:
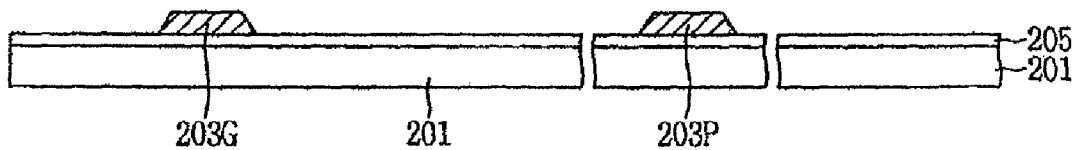
FIGS. 3*a* to 3*i* are sectional views showing the schematic construction of an FFS mode LCD according to the present disclosure.

As shown in FIG. 3*a*, a substrate 201, on which the TFT part, the pixel part, the gate pad part and the data pad part are defined, is provided. In this case, the substrate 201 refers to a TFT array substrate. Subsequently, a metallic film (not shown) for gate lines (a gate line metallic film) is formed over the entire surface of the substrate 201. A buffer film 205 may be interposed between the substrate 201 and the metallic film. The gate line metallic film may be metal such as Al, Cu, Ta, Ti, Mo, a molybdenum alloy, an aluminum alloy, etc.

Next, the gate line metallic film is patterned to form a gate line having a gate electrode 203G and a gate pad 203P. In this case, the gate line may be formed by patterning the gate line metallic film through a printing process. The printing process may be performed by using one of a roll printing method and an in-plane printing method (a first printing process).

Figure 3B:
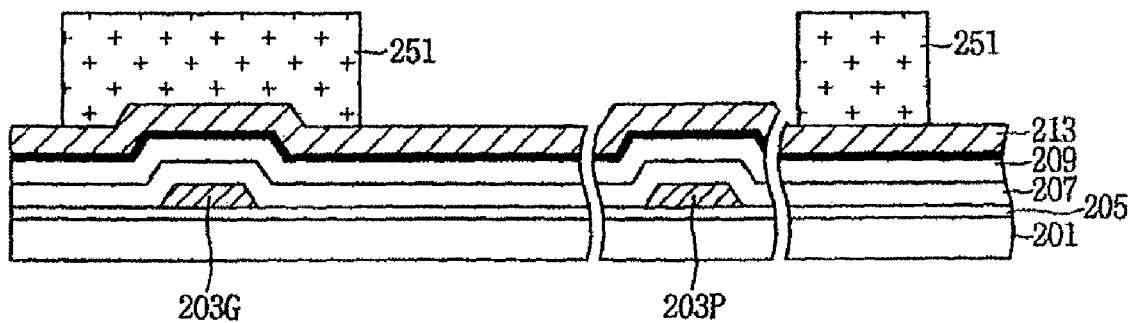

Thereafter, as shown in FIG. 3b, a gate insulating layer 207, a semiconductor layer 209, and a data line metallic film 213 are sequentially formed on the substrate with the gate line 203 formed thereon. In this case, the gate insulating layer 207 may be a silicon nitride. The semiconductor layer 209 may be a silicon film. The data line metallic film 213 may be a metal such as Al, Cu, Ta, Ti, Mo, a molybdenum alloy, an aluminum alloy, etc., the same as the gate line metallic film.

Subsequently, a first photosensitive film pattern 251 is formed on the substrate with the data line metallic film 213 formed thereon. In this case, the first photosensitive film pattern 251 is patterned to selectively cover portions of the TFT part and the data pad part. Here, the first photosensitive film pattern 251 may be formed through a printing process. The printing process may be performed by using any one of the roll printing method and the in-plane printing method (a second printing process).

Figure 3C:
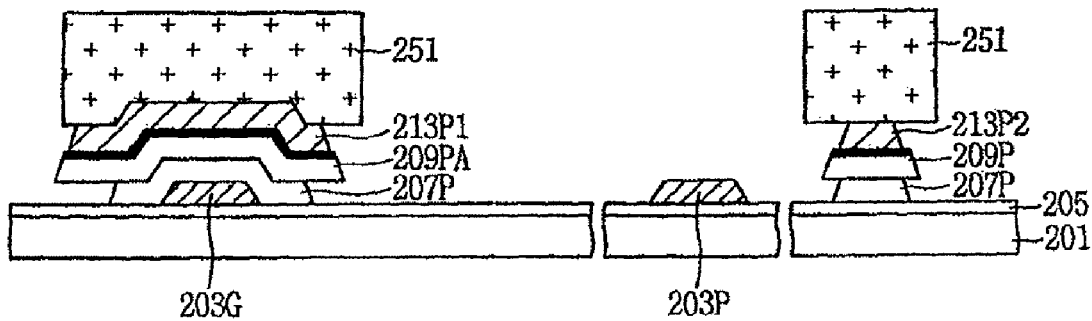

Then, as shown in FIG. 3c, the data line metallic film, the semiconductor layer, and the gate insulating layer are etched by using the first photosensitive film pattern 251 as a mask to form a gate insulating layer pattern 207P, a preliminary active pattern 209A, and a data line which are sequentially stacked. The data line includes a metallic film pattern 213P1 formed at the TFT part and a data pad 213P2 formed at the data pad part. The gate insulating layer pattern 207P is formed to have an undercut shape from the sides of the preliminary active pattern 209A by over-etching the gate insulating layer.

Figure 3D:
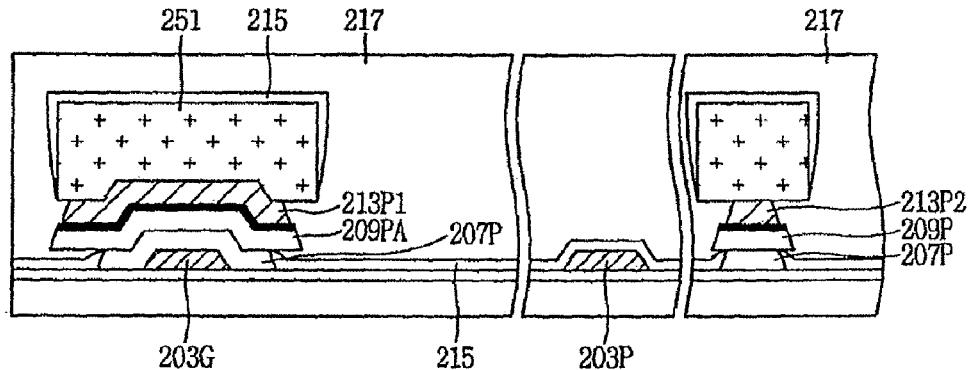

Next, as shown in FIG. 3d, a first transparent conductive film 215 and an insulating layer 217 are sequentially formed to cover the first photosensitive film pattern 251 on the substrate with the metallic film pattern 213P1 formed thereon. In this case, the first transparent conductive film 215 corresponds to a common electrode film to form a common electrode and may be made of ITO. The insulating layer 217 may be formed by coating an organic insulating layer. The insulating layer 217 may planarize (smooth) the entire surface of the substrate with the first transparent conductive film 215.

Figure 3E:
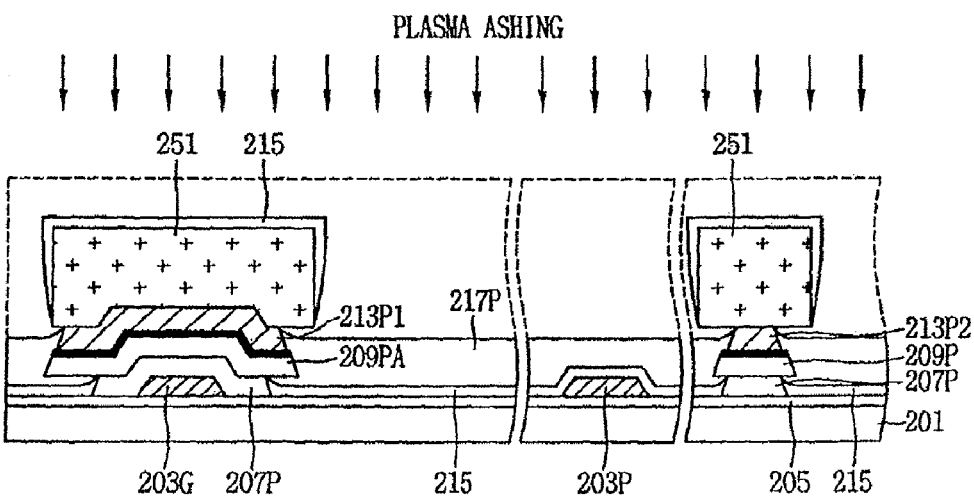

Thereafter, as shown in FIG. 3e, the insulating layer is first etched until the metallic film pattern 213P1 is exposed. In this case, the first etching process of the insulating layer may be performed by using an ashing process using plasma. O2 gas may be used in the plasma process.

Through the ashing process using plasma, the insulating layer 217P may be first etched to expose the side of the first transparent conductive film 215 on the first photosensitive film pattern 251 and the side of the first photosensitive film pattern 251 and cover the metallic film pattern 213P1. In FIG. 3e, the part indicated by dotted lines shows an initial thickness of the insulating layer before being first etched.

Figure 3F:
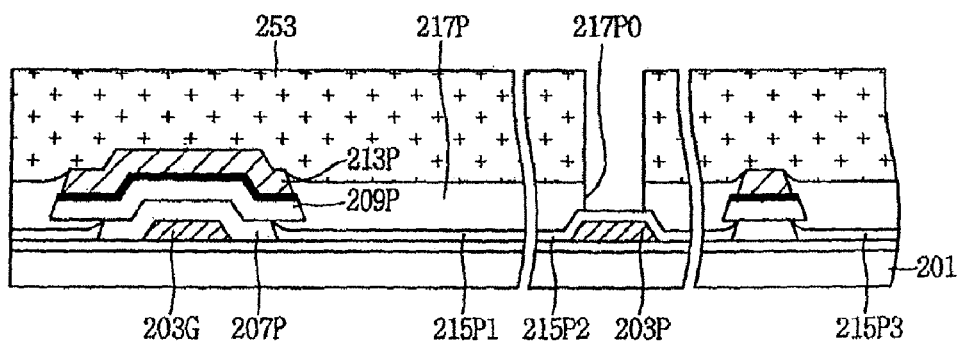

Subsequently, as shown in FIG. 3f, the first photosensitive film pattern 251 and the first transparent conductive film 215 on the first photosensitive film pattern are removed. Here, the first photosensitive film pattern and the first transparent conductive film on the first photosensitive film pattern may be removed by performing a lift-off method. Of the first transparent conductive film 215 on the first photosensitive film pattern 251 is removed, and then, the first photosensitive film pattern is removed. In this case, while the first photosensitive film pattern 251 and the first transparent conductive film on the first photosensitive film pattern are removed, the insulating layer remaining after etching serves to support the metallic film pattern 213P1. Hereinafter, the first transparent conductive film arranged to be parallel to the gate line will be referred to as a common electrode 215P1, and the first transparent conductive films remaining at the gate pad part and the data pad part will be referred to as first transparent conductive film patterns 215P2 and 215P3.

The first transparent conductive film remaining at the pixel part corresponds to the common electrode 215P1.

The first transparent conductive films remaining at the gate pad part and the data pad part correspond to the first transparent conductive film patterns 215P2 and 215P3.

A second photosensitive film pattern 253 is formed on the substrate with the first-etched insulating layer 217P formed thereon. IN this case, the second photosensitive film pattern 253 is patterned to entirely cover the TFT part, the pixel part and the data pad part and expose a certain region of the gate pad part. In this case, the second photosensitive film pattern 253 may be formed through a printing process (a third printing process). The printing process may be performed by using any one of the roll printing method and the in-plane printing method.

Subsequently, the first-etched insulating layer is second etched by using the second photosensitive film pattern 253 as a mask to form an opening 217PO at the gate pad part (photomasking process).

Figure 3G:
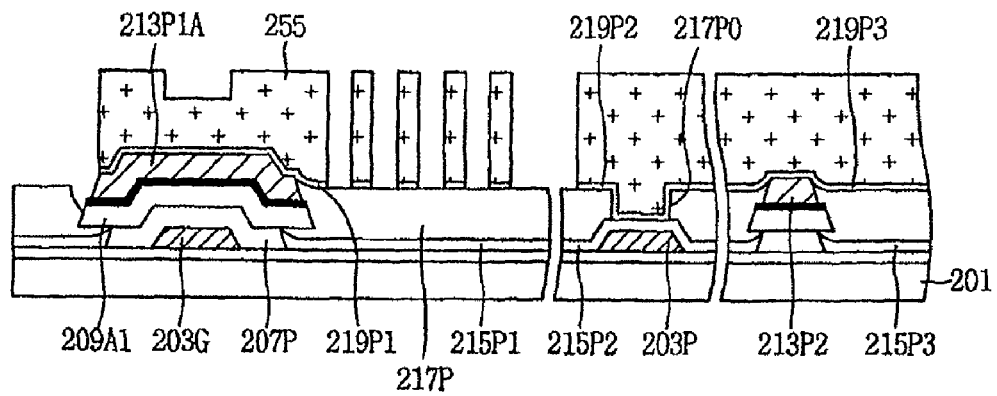

Next, as shown in FIG. 3g, the second photosensitive film pattern is removed, and then, a second transparent conductive film is formed over the entire surface of the substrate having the opening 217PO. In this case, the second transparent conductive film is to form a pixel electrode and can be made of ITO or IZO.

Then, a photosensitive film is coated on the second transparent conductive film, which is then exposed and developed to form a third photosensitive film pattern 255 in order to form a channel and a pixel electrode at the TFT part (a first photomasking process). In this case, the third photosensitive film pattern 255 may have different thicknesses. That is, the third photosensitive film pattern may be formed to be thinner at the channel formation region of the TFT than at other regions.

Next, the second transparent conductive film is etched by using the third photosensitive film pattern 255 as a mask to form a pixel electrode 219P1 and, at the same time, to form second transparent conductive film patterns 219P2 and 219P3 at the gate pad part and the data pad part. In this case, the second transparent conductive film pattern 219P2 is electrically connected with the first transparent conductive film pattern 215P2 on the gate pad 203P via the opening 217PO at the gate pad part.

Subsequently, the remaining insulating layer, the metallic film pattern and the preliminary active pattern are etched by using the third photosensitive film pattern 255 as a mask to form an active pattern 209A1 and a preliminary source/drain electrode pattern 213P1A which are sequentially stacked.

Figure 3H:
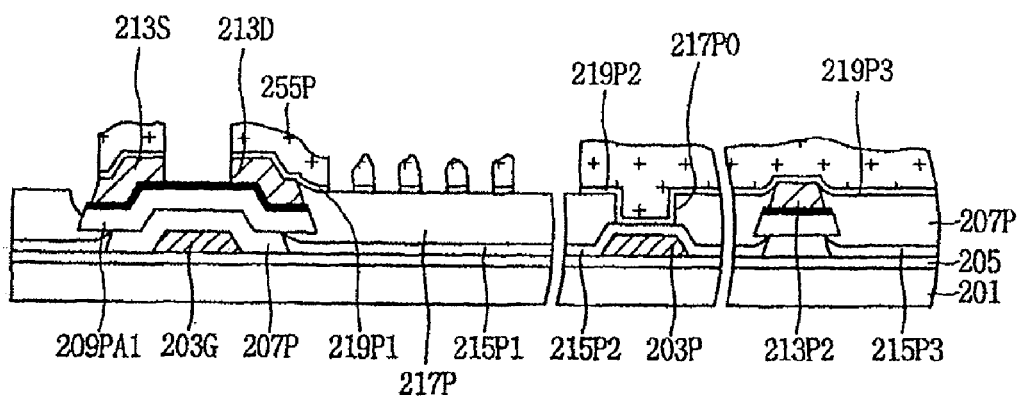

Then, as shown in FIG. 3h, the third photosensitive film pattern is ashed to expose the second transparent conductive film corresponding to the channel formation region of the TFT part. Thereafter, the second transparent conductive film and the preliminary source/drain electrode pattern are etched by using the ashed third photosensitive film pattern 255P as a mask to form source and drain electrodes 213S and 213D.

Figure 3I:
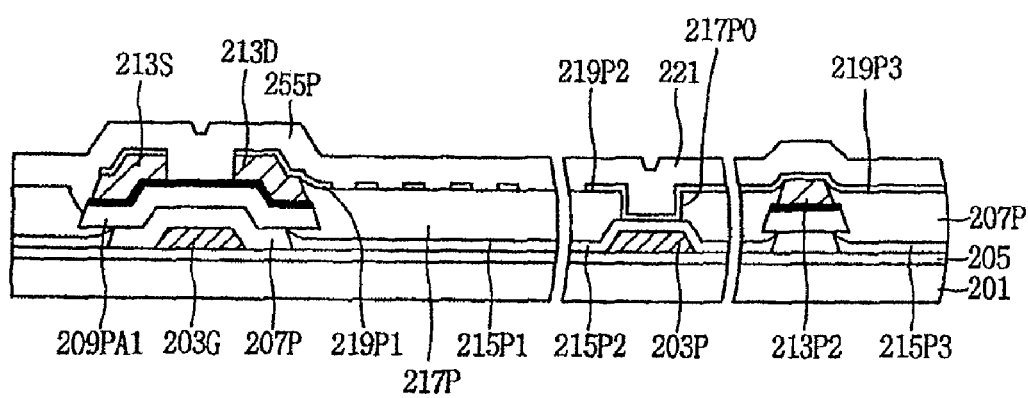

Thereafter, as shown in FIG. 3i, the ashed third photosensitive film pattern is removed, and a passivation film 221 is formed on the substrate with the source and drain electrodes 213S and 213D formed thereon.

As shown in FIG. 3i, the LCD formed by using the above-described method according to the present disclosure includes the substrate 201 on which the TFT part, the pixel part, the gate pad part, and the data pad part are defined, the gate electrode 203G and the gate pad 203P formed on the substrate 201, the gate insulating layer pattern 207P, the active pattern 209PA1 and the source and drain electrodes 213S and 213D sequentially formed on the substrate with the gate pad 203 formed thereon, the first transparent conductive film pattern 215P2 covering the common electrode 215P1 and the gate pad 203P on the substrate with the source and drain electrodes 213S and 213D and formed of the same layer as the common electrode 215P1, the insulating layer 217P covering the substrate with the first transparent conductive film pattern 215P2 formed thereon and having the opening 217P0 exposing the source and drain electrodes 213S and 213D and a portion corresponding to the gate pad 203P, and the pixel electrode 219P1 formed on the insulating layer 210P to cover the drain electrode 213D and formed of the same layer as the pixel electrode 219P1.

The gate insulating layer pattern 207P is formed to have an undercut shape from the sides of the active pattern 209PA1.

As so far described, the FFS mode LCD according to the present invention is fabricated by using a total of three printing processes and the single photomasking process. In detail, the gate line having the gate electrode and the gate pad is formed by using the first printing process, the metallic film pattern for forming the source and drain electrodes is formed by using the second printing process, the opening exposing the gate pad is formed by using the third printing process, and the source, drain and pixel electrodes are formed by using the photomasking process in sequence. Thus, the photomasking process can be simplified.

The present invention provides the LCD fabricated through the total three printing processes and the single photomasking process and its fabrication method. Thus, the photomasking process can be simplified, and accordingly, the material cost and facility investment costs can be reduced and the production yield can be improved.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

The invention claimed is:

1. A method for fabricating a liquid crystal display, comprising:
   providing a substrate on which a thin film transistor (TFT) part, a pixel part, and a gate pad part are formed;
   forming a metallic film for a gate line on the substrate;
   etching the gate line metallic film through a first printing process to form a gate line having a gate electrode and a gate pad at the TFT part and the pad part;
   sequentially forming a gate insulating layer, a semiconductor layer and a metallic film for a data line on the substrate;
   forming a resist pattern covering a portion of the TFT part on the substrate with the data line metallic film formed thereon through a second printing process;
   etching the data line metallic film, the semiconductor layer and the gate insulating layer by using the resist pattern as a mask to form a gate insulating layer pattern, a preliminary active pattern and a metallic film pattern that are sequentially stacked, the gate insulating layer pattern being formed to be undercut at the sides of the preliminary active pattern;
   sequentially forming a first transparent conductive film and an insulating layer to cover the resist pattern on the substrate with the metallic film pattern formed thereon;
   partially etching the insulating layer until the metallic film pattern is exposed;
   selectively etching the remaining insulating layer through a third printing process to form an opening exposing a portion of the first transparent conductive film pattern;
   removing the resist pattern and the first transparent conductive film on the resist pattern to form a common electrode arranged to be parallel to the gate line;
   forming a second transparent conductive film on the substrate having the opening; and
   selectively etching the second transparent conductive film, the metallic film pattern and the preliminary active pattern to form an active pattern, a source electrode, a drain electrode and a pixel electrode connected with the drain electrode.

2. The method of claim 1, wherein the forming of the gate insulating layer pattern, the preliminary active pattern and the metallic film pattern comprises:
   forming the resist pattern on the data line metallic film through the second printing process; and
   etching the data line metallic film, the semiconductor layer and the gate insulating layer by using the resist pattern as a mask.

3. The method of claim 2, wherein the insulating layer is etched by performing an ashing process.

4. The method of claim 2, wherein the plasma ashing process uses $O_2$ gas.

5. The method of claim 1, wherein the insulating layer is formed as an organic insulating layer.

6. The method of claim 1, wherein the resist pattern and the common electrode film on the resist pattern are removed through a lift-off method.

7. The method of claim 1, further comprising:
   forming a photoresist pattern formed to be thinner at a channel formation region of the TFT part than at other regions on the second transparent conductive film, after the second transparent conductive film is formed.

8. The method of claim 7, wherein the forming of the source and drain electrodes and the pixel electrode comprising:
   etching the second transparent conductive film, the metallic film pattern and the preliminary active pattern by using the photoresist pattern to form a preliminary pixel electrode pattern, a preliminary source and drain electrode pattern, and an active pattern;
   ashing the photoresist pattern;
   etching the preliminary pixel electrode pattern, the preliminary source and drain electrode pattern using the ashed photoresist pattern; and
   removing the ashed photoresist pattern.

9. The method of claim 1, further comprising:
   forming a passivation film on the substrate with the pixel electrode formed thereon, after forming the source and drain electrodes and the pixel electrode.

* * * * *